(12) United States Patent
Lasseuguette

(10) Patent No.: US 7,466,595 B2
(45) Date of Patent: Dec. 16, 2008

(54) LOW-VOLTAGE READING DEVICE IN PARTICULAR FOR MRAM MEMORY

(75) Inventor: Jean Lasseuguette, Saint Martin d'Heres (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 12/033,795

(22) Filed: Feb. 19, 2008

(65) Prior Publication Data

US 2008/0137430 A1 Jun. 12, 2008

Related U.S. Application Data

(63) Continuation of application No. 11/281,264, filed on Nov. 17, 2005, now abandoned.

(30) Foreign Application Priority Data

Nov. 17, 2005 (FR) .................................. 04 12194

(51) Int. Cl.
*G11C 16/06* (2006.01)
(52) U.S. Cl. .............................. 365/185.21; 365/185.2; 365/210.01; 365/189.07
(58) Field of Classification Search ............ 365/185.21, 365/185.2, 210.01, 189.07
See application file for complete search history.

(56) References Cited

U.S. PATENT DOCUMENTS

| | | | |
|---|---|---|---|
| 5,886,925 A * | 3/1999 | Campardo et al. | ..... 365/185.21 |
| 5,917,753 A | 6/1999 | Dallabora et al. | |
| 6,055,187 A | 4/2000 | Dallabora et al. | |
| 6,600,690 B1 | 7/2003 | Nahas et al. | |

FOREIGN PATENT DOCUMENTS

EP            0 805 454 A       11/1997

OTHER PUBLICATIONS

French Search Report from corresponding French Application No. 0412194, filed Nov. 17, 2004.

* cited by examiner

*Primary Examiner*—David Lam
(74) *Attorney, Agent, or Firm*—Lisa K. Jorgenson; James H. Morris; Wolf, Greenfield & Sacks, P.C.

(57) ABSTRACT

The invention relates to a circuit for reading a cell of a bit line, including first and second transistors for controlling the bit line and a reference line, respectively, a reference transistor connected to the second control transistor and a write transistor of the reference current connected to the first control transistor, for comparing the current of the bit line and the reference current, characterized in that a first intermediate transistor is connected to the write transistor parallel to the first control transistor, and in that a second intermediate transistor is connected between the gate and the drain of the reference transistor parallel to the second control transistor, and polarization transistors are connected in series, respectively, to the intermediate transistors so as to superimpose a current over the reference current.

20 Claims, 3 Drawing Sheets

LOW-VOLTAGE READING DEVICE IN PARTICULAR FOR MRAM MEMORY

CROSS REFERENCE TO RELATED APPLICATIONS

This application is a continuation of prior application Ser. No. 11/281,264, filed Nov. 17, 2005, now abandoned, entitled LOW-VOLTAGE READING DEVICE IN PARTICULAR FOR MRAM MEMORY, which is incorporated herein by reference.

BACKGROUND OF THE INVENTION

1. Field of the Invention

This invention relates in general to the field of semiconductor memories and, more specifically, the read-out circuits implemented in these memories for detecting the logic programming state of the storage cells.

The invention will be described in reference to magnetic random access memories (MRAM), although it can be applied to other types of memory.

2. Discussion of the Related Art

MRAMs are non-volatile memories. Typically, a magnetic random access memory device includes a matrix of cells arranged in rows and columns, through which metal tracks are routed. The metal tracks extending along the memory cell rows are called word lines and the metal tracks extending along the memory cell columns are called bit lines. Each memory cell thus located at the intersection of a word line and a bit line stores a data bit in the form of a magnetization orientation.

Each of the memory cells indeed consists of two magnetic layers, separated by a dielectric layer. Each magnetic layer has a specific magnetization orientation. The magnetization orientation of one of the layers, a so-called free layer, can be modified, while the magnetization orientation of the other, so-called fixed layer, is fixed in a particular orientation. The magnetization orientations of the two layers can be found in two situations: either parallel, i.e. aligned in the same directions, or anti-parallel, i.e. aligned in opposite directions. These two orientations, parallel and anti-parallel, represent the logic values "1" and "0", respectively. Alternatively, the parallel state can be interpreted as a logic "0" and the anti-parallel state as a logic "1".

Consequently, the writing for such a memory cell involves positioning the magnetization orientation in the free layer according to the desired logic state, in either a parallel state or an anti-parallel state, with respect to the magnetization orientation of the fixed layer, by imposing a sufficient magnetic field on the tunnel junction.

Typically, external magnetic fields are applied to a cell selected to switch the magnetization orientation in the free layer of this cell from one state to the other. To do this, a writing current is applied respectively to the word line and the bit line intersecting at the location of the selected memory cell. The writing currents thus applied to the selected word line and bit line create magnetic fields that, when they are combined at the intersection of the word line and the bit line, enable the magnetization orientation of the free layer of the selected memory cell to be switched from the parallel to the anti-parallel state, or the reverse, according to the data that is to be written into the cell.

In the reading, a voltage is applied to the terminals of the memory cell concerned by means of a CMOS control transistor, and the current circulating through the read bit line is measured, its value representing the tunnel junction resistance. The read bit line therefore enables information on the state of a memory cell located at the intersection of this bit line and a selected word line to be transmitted. The read-out circuits are connected to the bit lines, optionally by means of a multiplexer if there is a plurality of bit lines for a single read-out circuit. The constitution of a single read-out circuit, considered to be connected to a single bit line, will be described below so as to simplify the explanations.

The resistance of the junction is dependent on the respective magnetization orientation of the two magnetic layers. The resistance changes from a lower resistance value, corresponding, for example, to the low logic state, when the magnetization orientation of the two layers is aligned in the same direction, to a higher resistance value, corresponding, for example, to the high logic state, when the magnetization orientation of the two layers is in opposite directions. The general principle of a read-out circuit is therefore to detect this difference in value so as to read the information stored by the memory cell concerned. It is routine in the prior art to detect the programming state of a memory cell by comparing the value of the tunnel junction resistance of this cell with a reference value corresponding to the mean value of the resistances of a reference memory cell in the high logic state and a reference memory cell in the low logic state.

U.S. Pat. No. 6,600,690 describes a read-out circuit implementing this principle. FIG. 1 shows a simplified example of a read-out circuit according to the teaching of this document.

A memory cell, represented by the resistor Bit, can be selected and delivers information on the bit line BL. To do this, the bit line BL is polarized at a fixed reading voltage, by an NMOS control transistor N2, which is intended to provide a current Ibit to the bit line while limiting the potential at the terminals of the memory cell to a predetermined constant value, enabling the very low thickness of the oxide on which the magnetic tunnel junction of the memory cell is based to be taken into account. Then, the actual reading phase takes place and the current Ibit of the bit line is compared to a reference current, so as to determine the programming state of the selected cell.

Two reference lines LR1 and LR2, with characteristics very similar to the bit line, are also therefore polarized for the reading, while being limited in voltage by means of an NMOS control transistor N1 and an NMOS control transistor N3. During the reading phase, these two reference lines consume a current equivalent to that, Ilow, which is consumed by a memory cell programmed to the low logic state, represented by the resistor Reflow placed in the low impedance state, and that, Ihigh, which is consumed by a memory cell programmed to the high logic state, represented by the resistor Refhigh placed in the high impedance state.

To read the state of the memory cell, a comparison will be made between the current consumed by the bit line and a reference current. More specifically, the current consumed by the bit line will be compared to a reference current which is an average of the currents consumed by a cell programmed to the high logic state and a cell programmed to the low logic state.

To do this, in a first branch, the drain of the NMOS transistor N2 is connected to the resistor Bit. The gate of the transistor N2 is connected to a control voltage Vsacg generated so as to maintain a constant potential on the bit line, taking into account the aforementioned constraint. The source of the transistor N2 is connected to the drain of a PMOS transistor P2, of which the source is connected to a supply voltage Vdd. An output node Out is provided at the level of the drain of the transistor P2 so as to provide the output signal of the read-out circuit.

In a second branch, the drain of the NMOS transistor N1 is connected to the reference memory cell Reflow placed in the low logic state. The gate of N1 is connected to the gate of the transistor N2 and the source is connected to the drain of a PMOS transistor P1, of which the source is connected to the supply voltage Vdd. The gate of the transistor P1 is connected to its drain and to the gate of the PMOS transistor P2.

In a third branch, the drain of the NMOS transistor N3 is connected to the reference memory cell Refhigh placed in the high logic state and to the drain of the transistor N1 of the second branch, thus placing the two reference memory cells Reflow and Refhigh in short circuit. The gate of N3 is connected to the gate of transistor N2 and its source is connected to the drain of a PMOS transistor P3, the source of which is connected to the supply voltage Vdd and the gate of which is connected to the gate of transistor P1. A reference output node Outref is provided at the level of the drain of transistor P3 so as to provide a reference output signal of the read-out circuit.

A reference current Iref is thus generated by the two PMOS transistors P1 and P3, and the two NMOS transistors N1 and N3, with Iref=(Ilow+Ihigh)/2. The two transistors P1 and P3 form a current mirror with transistor P2. To simplify the explanation, we will now describe FIG. 2, which is a simplified representation of the stage of the read-out circuit of FIG. 1 with only one PMOS transistor P1 and only one NMOS transistor N1 for generating the reference current Iref.

Transistors P1 and P2 are therefore in a current mirror configuration. The first branch of the mirror includes the write transistor P2; the second branch includes the reference transistor P1. Thus, the write transistor P2 tends to copy the reference current Iref which circulates in the reference transistor P1. The potential at the level of the output node Out of the read-out circuit then varies according to the difference of currents Iref−Ibit, making it possible to determine, by comparison with the reference node Outref providing a potential representative of a cell in the intermediate logic state between the high and low logic states, whether the selected cell is in a programming state corresponding to the high or low logic state.

The problems of such an architecture are described in reference to FIG. 3, showing the reference branch of FIG. 2, and are essentially associated with the low supply voltage Vdd used, typically of around 900 mV.

The polarization voltage Vbitline of the reference bit line required by transistor N1 must also be sufficiently high. Indeed, in view of the resistance values to be considered, of around ten kiloOhms, a polarization of the bit line at an excessively low voltage would result in circulation of an excessively low current in the bit line. Therefore, the Vbitline is selected at around 300 mV, which is a good compromise between the need to have sufficiently high bit line currents and the need to preserve the thin oxide of the tunnel junction.

In addition, as the NMOS transistor N1 operates in the saturated zone, a drain-source saturation voltage Vdssat above 100 mV must be maintained at the terminals of the transistor.

All that remains is 500 mV for the gate-source voltage Vsg of the PMOS reference transistor P1. The PMOS transistor in the current mirror therefore has only a small amount of voltage Vsg available for its polarization.

As will be seen, this limitation becomes very important when considering the mismatch problem in the current mirror circuits. The mismatch is caused by variations in the characteristics of transistors inherent to the production method. Indeed, problems of repeatability in the transistor production method, for example at the level of the implantation of dopants, can cause the MOS transistors, which are intended to be strictly identical, to nevertheless have differing characteristics. Thus, the mismatch is misleading in the current mirror ratio, which is capable of falsifying the write current and, therefore, the variation in potential at the level of the output node OUT on which the reading is dependent.

The mismatch in a current mirror can be modelled by the following simplified equation, which corresponds to a low polarization condition (Vsg−Vt):

$$\sigma^2(\Delta Isd/Isd) \cong 4*A(Vt)^2/[(W*L)*(Vsg-Vt)^2]$$

wherein Isd is the drain-source current of the transistors in the current mirror, Vt is their threshold voltage, Vsg is their gate-source voltage and W*L is their size.

The variation on the saturation current drawn by the PMOS transistor is therefore dependent on three main factors according to the simplified equation: $A(Vt)^2$, $W*L$ and $(Vsg-Vt)^2$. The term $A(Vt)^2$ is a factor that cannot be altered and that is dependent on the production method. It is representative of the quality of the method in its capability to produce MOS transistors that are as similar as possible.

As regards the second term W*L, the greater the size of the MOS transmitters in the current mirror, the more limited the mismatch will be.

However, given the aforementioned constraint in the reading system with regard to the low voltage Vsg available for the polarization of the PMOS transistor in the current mirror, the term $(Vsg-Vt)^2$ will clearly have a very negative impact on the mismatch in the current mirror. Thus, there is a high probability that the variation on the saturation current drawn by the current mirror will be such that the reading is impossible. Indeed, since the differences in tunnel resistance to be measured, which enable the stored logic data to be provided, are small, the available signal to be detected for the reading, which is dependent on the difference between the reference current provided by the current mirror and the current circulating in the read bit line, is also relatively small. Thus, if the PMOS transistors cause too great a mismatch in the current mirror as explained above, the signal available for reading the information will not be operable.

It is possible to consider compensating for the negative impact of the term $(Vsg-Vt)^2$ by increasing the size W*L of the PMOS transistors of the current mirror and therefore their width W so as to achieve an acceptable mismatch. The drain capacity of the transistors will, however, increase in proportion to the W of the transistor. However, as this drain capacity is directly associated with the nodes Out and Outref of the circuit, the latter will be rendered more capacitive, which is disadvantageous in terms of reading speed. Indeed, the potentials will need more time to reach the level of the nodes Out and Outref in reading phase.

SUMMARY OF THE INVENTION

One aim of the invention is to overcome the disadvantages mentioned above, by proposing a new architecture of a circuit for reading a memory cell in an integrated circuit, which enables the constrains on the critical MOS transistors of the circuit to be reduced, while being suitable for low supply voltages.

In one embodiment, the invention provides a circuit for reading a semiconductor memory cell connected to a bit line, including at least one first reference line, a first transistor for controlling a bit line, a second transistor for controlling a reference line, a current mirror circuit including at least one reference transistor connected to the reference line by means of the second control transistor and a write transistor of the current fixed by the reference transistor connected to the bit line by means of the first control transistor, wherein the current mirror circuit makes it possible to compare, during a memory reading phase, the discharge current of the bit line and the discharge current of the reference line, a first intermediate transistor, the gate of which is connected to a fixed potential, is connected to the write transistor parallel to the first control transistor, and in that a second intermediate transistor, the gate of which is connected to the same fixed potential, is connected to the reference transistor parallel to the second control transistor by being inserted between the gate and the drain of the reference transistor, with first and second polarization transistors, the gate of which is connected to the same polarization potential, being connected in series to the first and second intermediate transistors, respectively, enabling a constant polarization current to be superimposed on the current fixed by the reference transistor.

According to an embodiment, the read-out circuit includes a second reference line, connected in short circuit to the first reference line, wherein the first and second reference lines correspond respectively to a memory cell placed in a low logic state and a memory cell placed in a high logic state.

According to an embodiment, the circuit includes a third transistor for controlling the second reference line, wherein the current mirror circuit includes a second reference transistor, the gate of which is connected to the gate of the first reference transistor, the second reference transistor is connected to the second reference line by means of the third control transistor, a third intermediate transistor, the gate of which is connected to the same fixed potential, is connected to the second reference transistor parallel to the third control transistor, and a third polarization transistor, the gate of which is connected to the same polarization potential is connected in series to the third intermediate transistor. Preferably, the control transistors and the polarization transistors are MOS transistors of a first conductivity type, and the transistors of the current mirror circuit and the intermediate transistor are MOS transistors of a second conductivity type, wherein the first conductivity type can be type N and the second conductivity type can be type P.

The circuit advantageously includes an output node of which the potential varies according to the difference between the current fixed by the reference transistor and the discharge current of the bit line, enabling the programming state of the memory cell to be determined, by comparison with the potential of a reference node representative of a memory cell in a reference logic state wherein the output node is located between the first intermediate transistor and the first polarization transistor, and the reference node is located between the second intermediate transistor and the second polarization transistor or the third intermediate transistor and the third polarization transistor.

The read-out circuit advantageously operates at a low supply voltage of around several hundred millivolts.

The invention also relates to an integrated circuit memory, including at least one read-out circuit according to the invention.

It preferably relates to a MRAM memory.

BRIEF DESCRIPTION OF THE DRAWINGS

The invention also relates to an integrated circuit including a read-out circuit or a memory according to the invention. Other features and advantages of this invention will be more clear from the following description given by way of an illustrative and non-limiting example, in reference to the appended figures in which.

DETAILED DESCRIPTION

Figure 4:
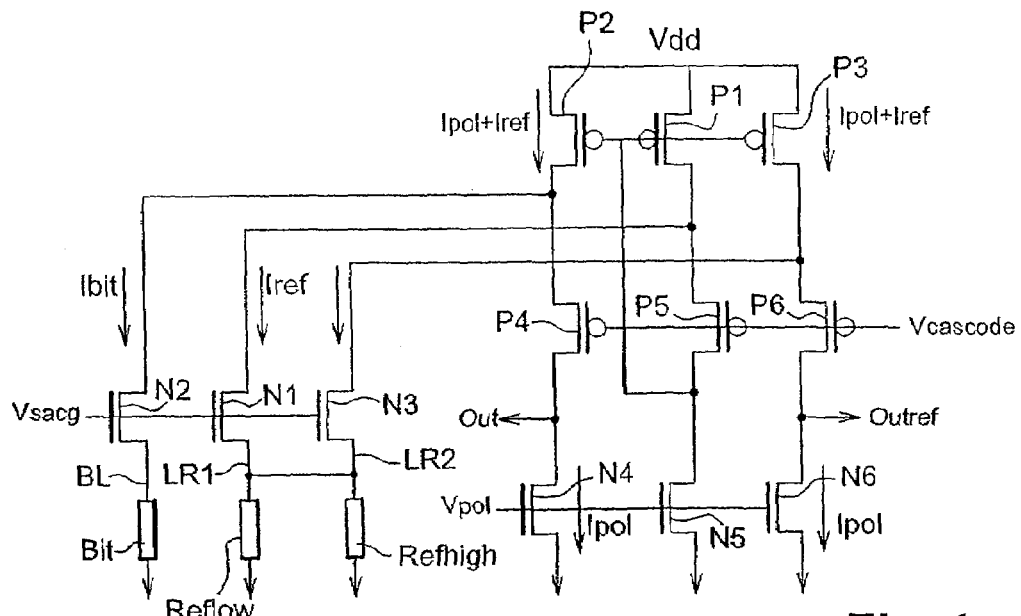
FIG. 4 is a diagram showing the principle of a read-out circuit according to a new architecture proposed by the present invention.

FIG. 4 shows a read-out circuit according to the present invention. The elements in common with the architecture of the prior art have the same references and the aforementioned principles of operation apply to them as well.

Thus, in addition to the bit line to which the memory cell Bit is connected, the circuit includes the two reference lines LR1 and LR2, connected in short circuit, including the reference memory cell Reflow corresponding to a low logic state and the reference memory cell Refhigh corresponding to a high logic state, respectively. Control transistors, N2, N1, and N3, respectively, are provided for the bit line, and the first and the second reference lines. The gates of these transistors are all connected to the same control potential Vsacg.

The read-out circuit includes a current mirror circuit of which the reference portion includes a first reference transistor P1, connected by its drain to the first reference line LR1 by means of the transistor N1, and a second reference transistor P3, connected by its drain to the second reference line LR2 by means of the transistor N3. The two reference transistors P1 and P3 have their gates connected together. The write portion of the current mirror includes a write transistor P2 of the current fixed by the reference portion of the mirror, connected by its drain to the bit line by means of the transistor N2. The sources of the transistors P2, P1 and P3 are connected to a supply voltage Vdd of the circuit.

The current mirror circuit thus makes it possible to compare, during a memory reading phase, the discharge current Ibit consumed by the bit line and the discharge current Iref consumed by the two reference lines. The success of this operation is associated in particular with the quality of the writing of the current in the mirror, which is degraded by the incidence of the mismatch between the PMOS of the mirror, which is all the more significant when operating at a low supply voltage. Indeed, in this context, as explained above, the low gate-source voltage then available for polarizing the PMOS of the current mirror has a very negative impact on the mismatch of the current mirror.

In addition, according to the invention, a transistor stage is inserted, according to a so-called "folded cascode" configuration, between the current mirror circuit and the circuitry formed by the bit line, the reference lines and their control transistors.

More specifically, a first intermediate PMOS transistor P4, the gate of which is connected to a fixed potential Vcascode, is connected by its source to the drain of the write transistor P2 of the current mirror, parallel to the control transistor N2 of the bit line BL.

A second intermediate PMOS transistor P5, the gate of which is connected to the same fixed potential Vcascode, is connected to the first reference transistor P1 of the current mirror, parallel to the control transistor N1 of the first reference line LR1, by being inserted between the gate and the drain of the reference transistor. More specifically, the source of the transistor P5 is connected to the drain of the transistor P1 and the drain of the transistor P5 is connected to the gate of the transistor P1.

A third intermediate PMOS transistor P6, the gate of which is connected to the fixed potential Vcascode, is connected by its source to the drain of the second write transistor P2 of the current mirror, parallel to the control transistor N3 of the second reference line LR2.

The PMOS transistor P4 is connected in series by its drain to the drain of a first NMOS polarization transistor N4, the gate of which is connected to a constant polarization potential Vpol and of which the source is connected to a circuit ground. The PMOS transistor P5 is connected in series by its drain to the drain of a second NMOS polarization transistor N5, the gate of which is connected to the polarization potential Vpol and of which the source is connected to a circuit ground. Finally, the PMOS transistor P6 is connected in series by its drain to the drain of an NMOS polarization transistor N6, the gate of which is connected to the constant polarization potential Vpol and of which the source is connected to a circuit ground. The NMOS transistors N4, N5 and N6 are polarized with rather high gate-source voltages, so as to minimize possible mismatch defects.

The NMOS transistors N4, N5 and N6 enable a constant current Ipol to be fixed, which will moreover be provided by the current mirror.

The examination of the output node Out, of which the potential varies according to the difference between the current fixed by the reference transistor and the discharge current of the bit line, enables the programming state of the memory cell Bit to be determined, by comparison with the potential of the reference node Outref representative of a memory cell in a reference logic state, corresponding to the intermediate logic state between the high and low states. The node Out is located at the level of the drain-drain connection between the first intermediate transistor P4 and the first polarization transistor N4, and the reference node is located at the level of the drain-drain connection between the third intermediate transistor P6 and the third polarization transistor N6.

This particular configuration of the transistors in the circuit therefore makes it possible to superimpose a constant polarization current Ipol, fixed by the NMOS transistors N4, N5 and N6, so as to increase the current drawn by the current mirror circuit. Thus, the current Ibit is still consumed by the bit line and the current Iref is still consumed by the reference lines, but the PMOS transistors of the current mirror circuit will also provide the current Ipol. In this way, it is guaranteed that the current provided by the PMOS transistors of the current mirror is more stable than the structure of the prior art.

Indeed, the variation in the current drawn by the PMOS transistors of the current mirror is dependent on the absolute value of the resistance of the memory element, which is not easily controlled in the production process. For example, if the resistance varies by ten kiloOhms, the current, with a bit line polarization voltage equal to 300 mV, varies by ten μA. By adding the current Ipol, for example, ten μA, to the current drawn by the PMOS transistors, the variation will then be slightly smaller overall. Thus, in this configuration, the polarization of the critical PMOS transistors of the current mirror is made easier, because it is not dependent on the absolute value of the magnetic tunnel resistance.

In addition, the circulation of a greater current equal to Iref+Ipol in the branches of the current mirror makes it possible to reduce the constraints on the gate-source voltage Vsg available at the level of the PMOS transistors of the mirror. Indeed, according to the standard equation of the behavior of an MOS transistor in saturation: $Isd=W/L*(Vsg-Vt)^2$, if the transistor draws a greater current, it will operate at a higher gate-source voltage.

Figure 1:
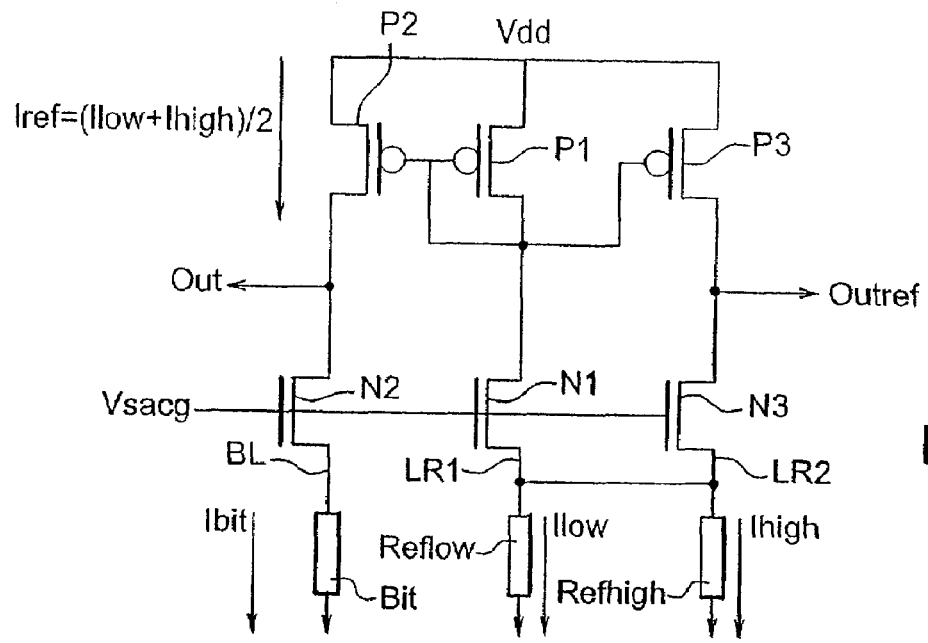
FIG. 1 is a diagram showing the principle of a read-out circuit according to the prior art and has already been described.
Figure 2:
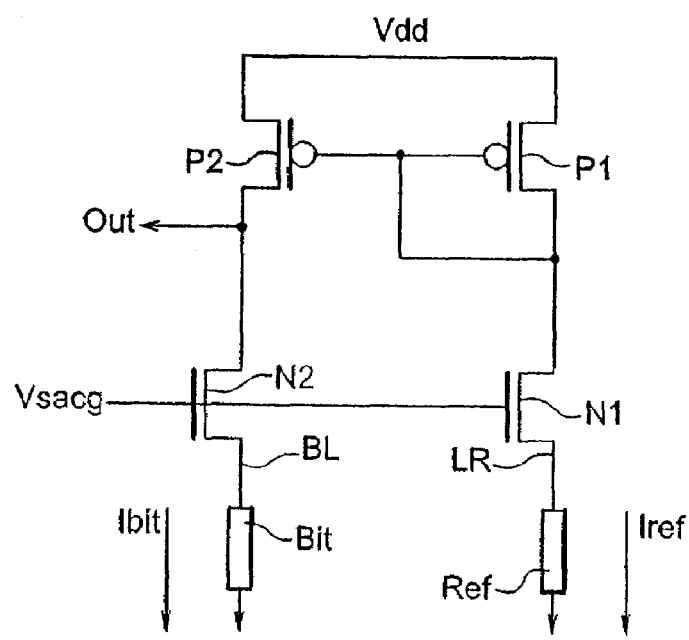
FIG. 2 is a simplified diagram of the circuit of FIG. 1.
Figure 3:
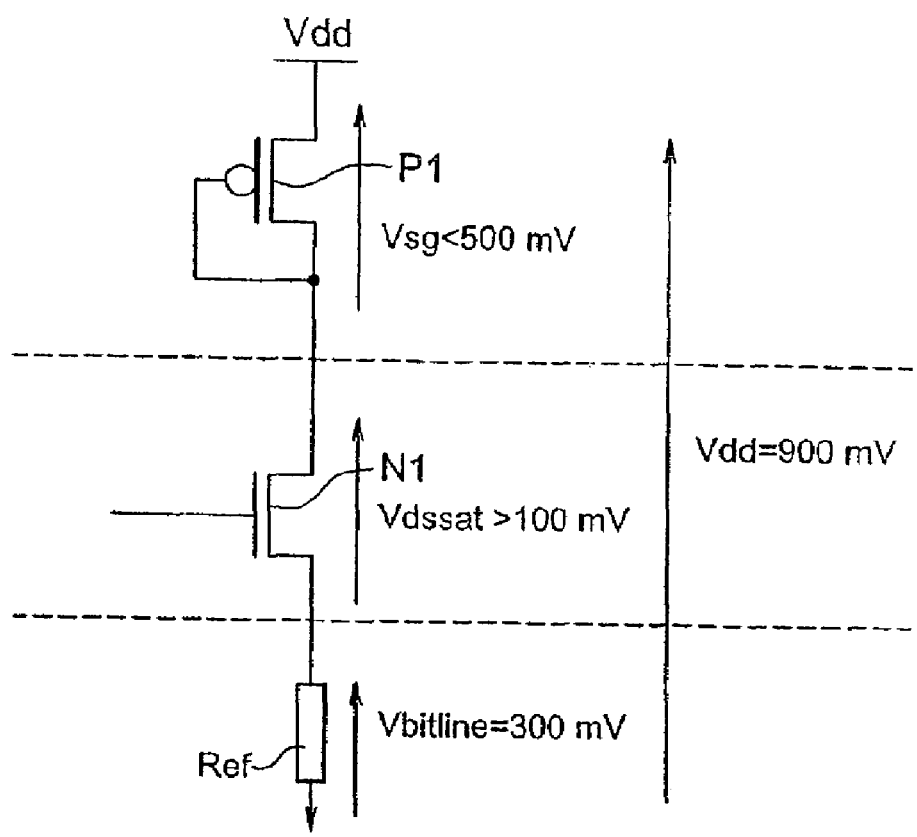
FIG. 3 is a diagram showing the problems associated with the low supply voltage of the prior art and has already been described.
Figure 5:
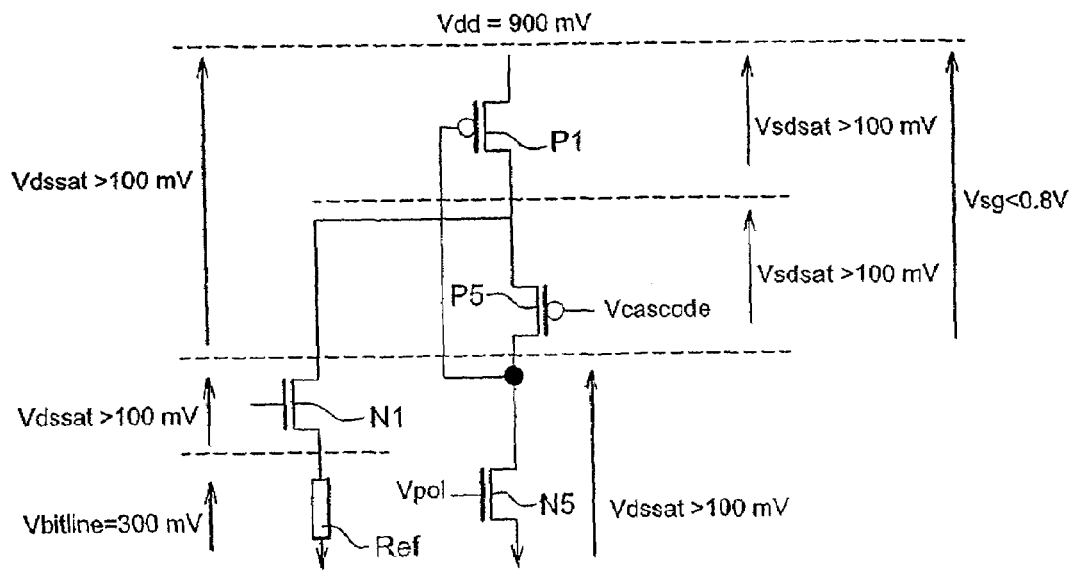
FIG. 5 is a diagram showing the distribution of voltages according to the new proposed architecture.

The feature of the invention, whereby the voltage Vsg available to polarize the PMOS transistor P1 of the current mirror is increased, is more clear in reference to FIG. 5. This Fig. shows the distribution of voltages in the circuit, considering the reference branch of the current mirror formed by the transistor P1 with its two charges connected in parallel, namely the constant polarization charge formed by the NMOS transistor N5 and the charge formed by the reference line. The architecture of the invention, to be compared with the diagram of FIG. 3, no longer involves the addition of all of the voltages, namely the polarization voltage of the reference bit line Vbitline, the saturation voltage Vdssat of the transistor N1 and the gate-source voltage of the PMOS transistor P1, or the limitation due to the lot supply voltage Vdd, for example equal to 900 mV, leaving only a low voltage available for the voltage Vsg of P1.

Indeed, the connection between the gate of the transistor P1 and its drain is transported to the other parallel branch, comprising transistors P5 and N5, at the level of the drain of transistor P5. The latter, which is located between the gate and the drain of the transistor P1, enables the voltage operating point of the gate of P1 to be offset downwards, thus providing the possibility of having a higher gate-source voltage Vsg available for P1, of up to 0.8V, taking into account that as the NMOS transistor N5 operates in the saturated zone, a drain-source saturation voltage Vdssat above 100 mV must be maintained at its terminals. The saturation condition must also be satisfied for the PMOS transistors P1 and P5.

The voltage at the drains of the PMOS transistors forming the current mirror is advantageously kept almost constant by being imposed by the source follower of the PMOS transistors of the cascode stage.

The structure according to the invention therefore significantly reduces the constraints at the level of polarization of PMOS transistors of the current mirror, and, more specifically, with regard to the possibility of controlling their maximum available gate-source voltage. This possibility also allows for better control of the mismatch in the current mirror, which can be optimized without compromising the aspects of reading speed and the surface occupied by the circuit.

Moreover, this solution is compatible with the use of low supply voltages, for example around 900 mV. For this reason, the invention has a particularly advantageous use in the context of MRAM memories, for which such supply voltages become necessary in manufacturing technologies starting at 120 nm.

Having thus described at least one illustrative embodiment of the invention, various alterations, modifications, and improvements will readily occur to those skilled in the art. Such alterations, modifications, and improvements are intended to be within the scope of the invention. Accordingly, the foregoing description is by way of example only and is not intended as limiting. The invention is limited only as defined in the following claims and the equivalents thereto.

What is claimed is:

1. A circuit for reading at least one semiconductor memory cell connected to a bit line, including:
   at least one first reference line;
   a first control transistor for controlling the bit line;
   a second control transistor for controlling the at least one first reference line;

a current mirror circuit including:
  at least one first reference transistor connected to the at least one first reference line by means of the second control transistor; and
  a write transistor of a current fixed by the at least one first reference transistor connected to the bit line by means of the first control transistor, wherein the current mirror circuit makes it possible to compare, during a memory reading phase, a discharge current of the bit line and a discharge current of the at least one first reference line;
a first intermediate transistor, a gate of which is connected to a fixed potential, connected to the write transistor in parallel to the first control transistor; and
a second intermediate transistor, a gate of which is connected to the same fixed potential, connected to the at least one first reference transistor in parallel to the first control transistor by being inserted between a gate and a drain of the at least one first reference transistor, with first and second polarization transistors, gates of which are connected to the same polarization potential, connected in series to the first and second intermediate transistors, respectively, enabling a constant polarization current to be superimposed on the current fixed by the at least one first reference transistor.

2. The circuit according to claim 1, further comprising a second reference line, connected in short circuit to the at least one first reference line, wherein the at least one first reference line and the second reference line correspond respectively to a memory cell placed in a low logic state and a memory cell placed in a high logic state.

3. The circuit according to claim 2, further comprising:
a third control transistor for controlling the second reference line, wherein the current mirror circuit includes a second reference transistor a gate of which is connected to the gate of the at least one first reference transistor, the second reference transistor is connected to the second reference line by means of the third control transistor;
a third intermediate transistor, a gate of which is connected to the fixed potential, connected to the second reference transistor in parallel to the third control transistor; and
a third polarization transistor, a gate of which is connected to the polarization potential, connected in series to the third intermediate transistor.

4. The circuit according to claim 1, wherein the first, second and third control transistors and the first, second and third polarization transistors are MOS transistors of a first conductivity type and the at least one first reference and write transistors of the current mirror circuit and the first and second intermediate transistors are MOS transistors of a second conductivity type.

5. The circuit according to claim 4, wherein the first conductivity type is type N and the second conductivity type is type P.

6. The circuit according to claim 1, further comprising an output node of which a potential varies according to a difference between the current fixed by the at least one first reference transistor and the discharge current of the bit line, enabling a programming state of the memory cell to be determined, by comparison with the potential of a reference node representative of a memory cell in a reference logic state, wherein the output node is located between the first intermediate transistor and the first polarization transistor, and the reference node is located between the second intermediate transistor and the second polarization transistor or the third intermediate transistor and the third polarization transistor.

7. The circuit according to claim 1, wherein the circuit operates at a low supply voltage, of around several hundred millivolts.

8. An integrated circuit memory including at least one read-out circuit according to claim 1.

9. The integrated circuit memory according to claim 8, wherein the memory is a magnetic random access memory.

10. An integrated circuit including a read-out circuit or a memory according to claim 1.

11. A method of reading at least one semiconductor memory cell connected to a bit line, the method comprising:
providing a plurality of reference lines;
providing a plurality of control transistors for controlling the bit line and the plurality of reference lines;
providing a current mirror circuit, with a reference portion of the current mirror circuit including at least one first reference transistor and a write portion of the current mirror circuit including a write transistor of a current fixed by the at least one first reference transistor;
providing a transistor stage between the current mirror circuit and circuitry formed by the bit line, the plurality of reference lines and the plurality of control transistors;
comparing, during a memory reading phase, a discharge current of the bit line and a discharge current of the plurality of reference lines;
providing a plurality of polarization transistors that enable a constant polarization current to be fixed; and
superimposing the constant polarization current on the current fixed by the at least one first reference transistor.

12. The method of claim 11 further comprising providing a circuit for reading the at least one semiconductor memory, the circuit comprising:
the plurality of reference lines comprising at least one first reference line;
the plurality of control transistors comprising:
  a first control transistor for controlling the bit line; and
  a second control transistor for controlling the at least one first reference line;
the current mirror circuit, wherein:
  the at least one first reference transistor is connected to the at least one first reference line by means of the second control transistor; and
  the write transistor is connected to the bit line by means of the first control transistor;
a first intermediate transistor connected to the write transistor in parallel to the first control transistor, wherein a gate of the first intermediate transistor connected to a fixed potential; and
a second intermediate transistor connected to the at least one first reference transistor in parallel to the first control transistor by being inserted between a gate and a drain of the at least one first reference transistor, wherein a gate of the second intermediate transistor is connected to the fixed potential; and
the plurality of polarization transistors comprising a first polarization transistor connected in series to the first intermediate transistor and a second polarization transistor connected in series to the second intermediate transistor, wherein gates of the first and second polarization transistors are connected to the same polarization potential.

13. The method of claim 12, wherein the plurality of reference lines further comprises a second reference line connected in short circuit to the at least one first reference line, wherein the at least one first reference line corresponds to a memory cell placed in a low logic state and the second reference line corresponds to a memory cell placed in a high logic state.

14. The method of claim 12, wherein the plurality of control transistors further comprises:
- a third control transistor for controlling the second reference line, wherein the current mirror circuit includes a second reference transistor connected to the second reference line by means of the third control transistor, wherein a gate of second reference transistor is connected to the gate of the at least one first reference transistor;
- a third intermediate transistor connected to the second reference transistor in parallel to the third control transistor, wherein a gate of the third intermediate transistor is connected to the fixed potential; and
- a third polarization transistor connected in series to the third intermediate transistor, wherein a gate of the third polarization transistor is connected to the polarization potential.

15. The method of claim 14, wherein the first, second and third control transistors and the first, second and third polarization transistors are MOS transistors of a first conductivity type and the at least one first reference and write transistors of the current mirror circuit and the first and second intermediate transistors are MOS transistors of a second conductivity type.

16. The method of claim 15, wherein the first-conductivity type is type N and the second conductivity type is type P.

17. The method of claim 14 further comprising determining a programming state of the memory cell, by comparing a potential of an output node of the circuit for reading the at least one semiconductor memory with a potential of a reference node representative of a memory cell in a reference logic state.

18. The method of claim 17, wherein the output node is located between the first intermediate transistor and the first polarization transistor, and the reference node is located between the second intermediate transistor and the second polarization transistor or the third intermediate transistor and the third polarization transistor, and wherein the potential of the output node varies according to a difference between the current fixed by the at least one first reference transistor and the discharge current of the bit line.

19. The method of claim 12, wherein the circuit operates at a low supply voltage.

20. The method of claim 19, wherein the low supply voltage comprises around several hundred millivolts.

* * * * *